US006966024B2

(12) United States Patent
Park

(10) Patent No.: US 6,966,024 B2
(45) Date of Patent: Nov. 15, 2005

(54) METHOD AND DEVICE FOR ADAPTIVE QUANTIZATION OF SOFT BITS

(75) Inventor: Young-Seo Park, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 109 days.

(21) Appl. No.: 10/335,651

(22) Filed: Dec. 31, 2002

(65) Prior Publication Data

US 2004/0128592 A1 Jul. 1, 2004

(51) Int. Cl.$^{7}$ ................................................ H03M 13/00
(52) U.S. Cl. ........................ 714/780; 714/774; 714/794
(58) Field of Search ................................ 714/780, 774, 714/794, 795

(56) References Cited

U.S. PATENT DOCUMENTS 6,347,124 B1 * 2/2002 Antia et al. ................. 375/341

OTHER PUBLICATIONS

Pilipchouk, N.I.; Asymptotic performances of DM, DPCM, ADPCM and adaptive quantizer with variable range, Information Theory Workshop, Jun. 22–26, 1998, pp.: 104–105.*

Goodman, D.; Wilkinson, R.; A Robust Adaptive Quantizer, IEEE Transactions on Communications, Nov 1975, vol.: 23, Issue: 11, pp.: 1362–1365.*

* cited by examiner

*Primary Examiner*—Joseph D. Torres

(57) ABSTRACT

A method and device for adaptive quantization of soft bits includes numerically sorting soft bits of an external data block having a log likelihood ratio distribution of the soft bits, each of the soft bits having a value, the sorted soft bits having extreme values, determining two point values in the log likelihood ratio distribution of the data block respectively located at a clipping distance away from each extreme value of the sorted soft bits, defining an adapted quantization range with a half-length equal to half of a difference between the two point values or with a half-length equal to a larger of two absolute values of the two point values, and placing each of the soft bits within a respective sub-range of the adapted quantization range. An adapted quantization range is determined whenever the log likelihood ratio distribution of the data block changes.

30 Claims, 5 Drawing Sheets

10
SYMBOL DETECTION (QAM)
Xr
11
LLR CALCULATION
LLR
12
ADAPTIVE QUANTIZATION
QUANTIZED SOFT BITS
13
SOFT DECODER (TPC)
DECODED BINARY BITS

```
% This file decodes a QPSK, 16QAM, 64QAM, symbols to soft bits of qlv level
% soft_det (Xr,M,clp,qlv,chgn), Xr=received symbols, M=# of constellation
% clp: clipping level of quantization range
% qlv: number of quantization level
% chgn: channel gain

function y = soft_det (Xr, M, clp, qlv, chng)

lvl   =  [-1  1   0   0   0   0   0   0;...     % QPSK Mapping
          3   1  -3  -1   0   0   0   0;...     % 16QAM Mapping
          7   5   1   3  -7  -5  -1  -3];       % 64QAM Mapping
lv    =   lvl (log2 (m) /2, 1:sqrt (M))+1);

for ii=1:M
      sym (ii,2)  =  lv (mod (ii-1, sqrt (M))+1);
      sym (ii,1)    =    lv (floor ((ii-1) /sqrt (M))+1);
end                                             % 16QAM symbols

I     =  sym(:,1);                              % I channel value
Q     =  sym(:,2);                              % Q channel value
symb  =  dec2bin (0:M-1) -48;                   % binary bits to 16QAM
%%%%%%%%%%%%%%%%%%%%%%%%%%%%%%%%%%%%%%%%%
Ir    =  real (Xr);                             % I channel symbols
Qr    =  imag (Xr) ;                            % Q channel symbols
smal  =  1E-200;                                % very small number

% Log likelihood ratio (LLR) calculation
for b=1:log2 (M)                                % each bits to 16QAM symbols
   ind1    =  find (symb(:,b)==1);
   I_Ir1   =  I (ind1)*ones (1, length (Ir))-ones (length (ind1), 1)*Ir;
   Q_Qr1   =  Q (ind1)*ones (1,length (Qr))-ones (length (ind1), 1)*Qr;
   r1      =  sum (exp( -(I_Ir1.^2+Q_Qr1.^2)));
   r1a     =  r1.*(r1>smal)+smal*(r1<=smal); % remove near 0 (using 1E-200)
   ind2    =  find (symb(:,b)==0);
   I_Ir2   =  I (ind2) *ones (1, length (Ir))-ones (length (ind2), 1)*Ir;
   Q_Qr2   =  Q (ind2) *ones (1, length (Qr))-ones (length (ind2), 1)*Qr;
   r2      =  sum (exp( -(I_Ir2.^2+Q_Qr2.^2)));
   r2a     =  r2.*(r2>smal)+smal*(r2<=smal); % remove near 0 (using 1E-200)
   lr0 (b,:)  =  log (r1a./r2a);                % LLR
end

chpwr     =  ones (log2 (M), 1)*abs(chng.^2) .';    % channel gain pwr matrix
lr        =  lr0.*chpwr;                            % LLR with channel gain
% Sort LLR soft bits
lrs       =  sort (lr(:));

% Apply clipping and determine quantization range and level width
qrg       =  2*max (abs(lrs(round((clp-1)*length (lrs)/clp))),
                   abs (lrs(round(length(lrs)/clp))));    % max absolute
qut       =  qrg/qlv;                                     % quantizaation level width

% Place LLR soft bits into quantization levels
llr       =  lr.* (abs(lr)<qrg/2)+(qrg/2-qut/100) *sign(lr).*(abs(lr)>=qrg/2);
q         =  floor((llr/qut))+qlv/2;                      % quantized decoded soft bits
y         =  q(:) . ' ;
return;                                                   %%% End of function call.
```

FIG. 7

METHOD AND DEVICE FOR ADAPTIVE QUANTIZATION OF SOFT BITS

BACKGROUND OF THE INVENTION

1. Field of the Invention

The invention lies in the field of electronic communications. The invention relates to a method and device for adaptive quantization of soft bits.

2. Description of the Related Art

Error correction coding is a general technique of digital communication systems to improve the power efficiency at the cost of the bandwidth efficiency. The performance of the error correction coding can be improved even more at a cost of the reasonable complexity when a soft decision technique is exploited. In comparison to a general hard decision technique that detects a received bit as a hard bit (which has only two levels 0 and 1), the soft decision technique detects a bit as a soft bit, which has more than 2 levels, for example, from 0 to 15 for a four-bit digital number. In this 16-level example, the level 15 of the soft bit is a very strong 1 and the level 8 of the soft bit is a very weak 1. Similarly, the level 7 of the soft bit is a very weak 0 and the level 0 of the soft bit is a very strong 0. These soft bits give more detailed information of the transmitting data, even though the channel distorts the data, than the less detailed information provided by the general hard bits with the same channel distortion. Accordingly, the soft decoding scheme of a coding scheme gives better error correction capability than the general hard decoding scheme.

The general procedure of a soft decision technique with a modulation such as PSK and QAM is set forth in FIG. 1. The PSK or QAM symbol of a single-carrier or a multi-carrier signal is received as a complex number Xr. The received symbol is demodulated to true soft bits, which are real numbers, by a log likelihood ratio ("LLR") calculation. The true soft bit, that is, the LLR of a soft bit, shows the degree of 0 or 1 of a received bit. A large positive number means the received bit is a strong 1 and a large negative number means that the received bit is a strong 0. In comparison, the small positive number means the received bit is a weak 1 and the small negative number means the received bit is a weak 0. To apply a soft detector in a real implementation, however, this continuous soft bit should be quantized to a discrete soft bit.

A significant goal of such a quantization procedure should be to maximize the decoder performance. Generally, quantization to a discrete soft bit is accomplished, in the prior art, with a linear quantization process, which determines the quantization range from −a to +b (b can be equal to a) and divides the range evenly to the more than 2 levels (16 levels in the above example). The LLR having a value smaller than −a is assigned to the first level (level 0 in the 16-level example) and the LLR having a value larger than +b is assigned to the last level (i.e., level 15). The quantized soft bits, then, become the input for a soft decoder, which decodes the coded soft bits to the decoded binary bits. This process is illustrated in FIG. 1.

In a linear quantization, each measurement within the entire range of the distribution is assigned to one of the levels, for example, to one of the sixteen levels. Significant, however, is the fact that for each measurement the quantization range is changing. The change occurs in the range because, for every block, the LLR distribution is changing. The change of the LLR distribution shape is caused by the different fading channels and because of the variance of the distribution due to the change of the ratio of energy per symbol ($E_s$) to noise density ($N_o$), also referred to as "Es/No."

Determination of the quantization range is very important because the bit error rate ("BER") performance of the communication system is improved when the quantization range is determined properly. However, a significant amount of information, such as the estimated noise level, is required to decide the right quantization level because the LLR distribution changes rapidly according to the signal power and the current channel characteristics. For example, in a static channel, if the signal power is very strong, then the distribution looks like a two narrow Gaussian distribution centered at a positive number and a negative number with each of the distributions having similar amplitude. In contrast, if the signal power is very low, then the distribution looks like a one Gaussian distribution centered at zero.

Two significant problems arise with respect to linear quantization of LLR. First, there is a problem of estimating an Es/No that is always changing, and, second, there is a problem of determining an appropriate quantization range of LLR when the range is always changing.

SUMMARY OF THE INVENTION

The invention provides a method and device for adaptive quantization of soft bits that overcome the hereinafore-mentioned disadvantages of the heretofore-known devices and methods of this general type and that determine a quantization range of LLR adaptively and, at the same time, determine an appropriate quantization range of LLR in the scalable advanced modulation ("SAM") system with turbo product codes ("TPC"). SAM is an advanced multi-carrier modulator, whose basic modulation is adaptively varying between QPSK, 16QAM, and 64QAM for a given channel condition.

With the foregoing and other objects in view, there is provided, in accordance with the invention, a method for adaptive quantization of soft bits, including the steps of numerically sorting soft bits of a data block having a log likelihood ratio distribution of the soft bits, each of the soft bits having a value, the sorted soft bits having extreme values, determining two point values in the log likelihood ratio distribution of the data block respectively located at a clipping distance away from each extreme value of the sorted soft bits, defining an adapted quantization range with a half-length equal to a larger of two absolute values of the two point values, and placing each of the soft bits within a respective sub-range of the adapted quantization range.

The method according to the invention introduces an adaptive quantization scheme to determine the quantization range properly for any LLR distribution without the need for a noise level estimation or the need for the channel information. The method according to the invention is simple and can be applied to any soft decision technique. In particular, the method according to the invention can be applied in the SAM system with TPC.

The method according to the invention determines a quantization range of LLR adaptively and, therefore, solves the problem of estimating Es/No that is always changing. The method also solves the problem of determining, at the same time, an appropriate quantization range of LLR in the SAM system with TPC.

With the objects of the invention in view, there is also provided a method for adaptive quantization of soft bits, including the steps of numerically sorting soft bits of a data block having a log likelihood ratio distribution of the soft bits, each of the soft bits having a value, the sorted soft bits having extreme values, determining two point values in the log likelihood ratio distribution of the data block respectively located at a clipping distance away from each extreme value of the sorted soft bits, one of defining an adapted quantization range with a half-length equal to half of a difference between the two point values and defining an adapted quantization range with a half-length equal to a larger of two absolute values of the two point values, and placing each of the soft bits within a respective sub-range of the adapted quantization range.

With the objects of the invention in view, there is also provided a method for adaptive quantization of soft bits, including the steps of determining an adapted quantization range whenever a log likelihood ratio distribution of an external data block changes by numerically sorting soft bits of the data block, each of the soft bits having a value, the sorted soft bits having extreme values, determining two point values in the log likelihood ratio distribution of the data block respectively located at a clipping distance away from each extreme value of the sorted soft bits, one of defining an adapted quantization range with a half-length equal to half of a difference between the two point values and defining an adapted quantization range with a half-length equal to a larger of two absolute values of the two point values, dividing the adapted quantization range into a given number of sub-ranges, and placing each of the soft bits within a respective one of the sub-ranges of the adapted quantization range. The value of each of the soft bits is a log likelihood ratio.

In accordance with another mode of the invention, there are also provided the steps of assigning a given integer to each of the sub-ranges and carrying out the placing step by defining each of the soft bits having a value within a respective one of the sub-ranges to be equal to the given integer of the corresponding respective one of the sub-ranges.

In accordance with a further mode of the invention, the placing step is carried out by defining each one of the soft bits as an integer equal to an integer identifier of a respective one of the sub-ranges.

In accordance with an added feature of the invention, the placing step is carried out by defining each of the soft bits having a value outside all of the sub-ranges to be equal to the given integer of the nearest one of the sub-ranges.

In accordance with an additional mode of the invention, the placing step is carried out by defining each of the soft bits having a value less than the lowest value of the adapted quantization range to be equal to the given integer corresponding to the lowest one of the sub-ranges and defining each of the soft bits having a value greater than the highest value of the adapted quantization range to be equal to the given integer corresponding to the highest one of the sub-ranges.

In accordance with yet another mode of the invention, the data block is received and a log likelihood ratio calculation is performed to produce the soft bits of the data block in the log likelihood ratio distribution.

In accordance with yet a further mode of the invention, the two point value determination step is carried out by determining two point values in the log likelihood ratio distribution located at a respective one of two clipping distances away from each extreme value of the sorted soft bits.

In accordance with yet an added mode of the invention, the clipping distance corresponds to between approximately 10% and approximately 35% of the range of values for the soft bits of the log likelihood ratio distribution. Preferably, the clipping distance corresponds to between approximately 15% and approximately 25%, in particular, approximately 20%.

In accordance with yet an additional mode of the invention, the dividing step is carried out by dividing the adapted quantization range into sixteen sub-ranges.

In accordance with again another mode of the invention, each of the sub-ranges has a given width. The given width of all of the sub-ranges can be the same. Alternatively, at least one given width of at least one of the sub-ranges is different from at least another given width of another of the sub-ranges.

In accordance with again a further mode of the invention, the adapted quantization range is centered at 0.

In accordance with again an added feature of the invention, the sorting, determining, defining, dividing, and placing steps are repeated for each changed external data block.

In accordance with again an additional mode of the invention, the distribution of the given integers is supplied to a soft decoder and decoded binary bits are output with the soft decoder.

With the objects of the invention in view, in an error correction coding device having a soft decoder and a log likelihood ratio calculation device providing a continuous log likelihood ratio value of demodulated true soft bits, the values of the soft bits of a data block forming a log likelihood ratio distribution, there is also provided a quantization device including an adaptive quantizer to be connected to the soft decoder and to the log likelihood ratio calculation device, the adaptive quantizer adaptively quantizing the demodulated true soft bits into discrete soft bits, the adaptive quantizer being programmed to numerically sort the soft bits of the data block, each of the soft bits having a value, the sorted soft bits having extreme values, to determine two point values in the log likelihood ratio distribution of the data block respectively located at a clipping distance away from each of the extreme values of the sorted soft bits, to define an adapted quantization range with sub-ranges, the adapted quantization range having a half-length equal to a larger of two absolute values of the two point values, and to place each of the soft bits within a respective one of the sub-ranges.

In accordance with still another feature of the invention, the adaptive quantizer is programmed to assign integer values corresponding to each of the sub-ranges to each of the soft bits within a respective one of the sub-ranges to, thereby, create adaptively quantized discrete soft bits.

In accordance with still a further feature of the invention, the adaptive quantizer is programmed to supply the adaptively quantized discrete soft bits to the soft decoder.

In accordance with still an added feature of the invention, the soft decoder is a TPC decoder.

In accordance with still an additional feature of the invention, the extreme values are two extreme values.

With the objects of the invention in view, there is also provided a quantization device, including an adaptive quantizer being programmed to numerically sort soft bits of a data block having a log likelihood ratio distribution, each of the soft bits having a value, the sorted soft bits having extreme values, to determine two point values in the log likelihood ratio distribution of the data block respectively located at a clipping distance away from each of the extreme values of the sorted soft bits, to define an adapted quantization range with sub-ranges, the adapted quantization range having a half-length equal to a larger of two absolute values of the two point values, and to place each of the soft bits within a respective one of the sub-ranges.

With the objects of the invention in view, there is also provided a quantization device, including means for numerically sorting soft bits of a data block having a log likelihood ratio distribution, each of the soft bits having a value, the sorted soft bits having extreme values, means for determining two point values in the log likelihood ratio distribution of the data block respectively located at a clipping distance away from each of the extreme values of the sorted soft bits, means for defining an adapted quantization range with sub-ranges, the adapted quantization range having a half-length equal to a larger of two absolute values of the two point values, and means for placing each of the soft bits within a respective one of the sub-ranges.

In accordance with a concomitant feature of the invention, there is provided means for assigning integer values corresponding to each of the sub-ranges to each of the soft bits within a respective one of the sub-ranges to, thereby, create adaptively quantized discrete soft bits.

With the objects of the invention in view, there is also provided an error correction coding system, including a log likelihood ratio calculation device receiving a signal as a complex number Xr and outputting a continuous log likelihood ratio value of demodulated true soft bits in a data block forming a log likelihood ratio distribution, a soft decoder, an adaptive quantizer connected to the soft decoder and to the log likelihood ratio calculation device, the adaptive quantizer being programmed to adaptively quantize the demodulated true soft bits into discrete soft bits by numerically sorting the soft bits of the data block, each of the soft bits having a value, the sorted soft bits having extreme values, determining two point values in the log likelihood ratio distribution of the data block respectively located at a clipping distance away from each of the extreme values of the sorted soft bits, defining an adapted quantization range with sub-ranges, the adapted quantization range having a half-length equal to a larger of two absolute values of the two point values, assigning integer values corresponding to each of the sub-ranges to each of the soft bits within a respective one of the sub-ranges to, thereby, create adaptively quantized discrete soft bits, and providing the adaptively quantized discrete soft bits to the soft decoder, and the soft decoder decoding the adaptively quantized discrete soft bits and outputting decoded binary bits.

Other features that are considered as characteristic for the invention are set forth in the appended claims.

Although the invention is illustrated and described herein as embodied in a method and device for a method and device for adaptive quantization of soft bits, it is, nevertheless, not intended to be limited to the details shown because various modifications and structural changes may be made therein without departing from the spirit of the invention and within the scope and range of equivalents of the claims.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

FIG. 7 is a computer program listing of a software routine for carrying out an exemplary embodiment of the method according to the invention.

DESCRIPTION OF THE PREFERRED EMBODIMENTS

Figure 1:
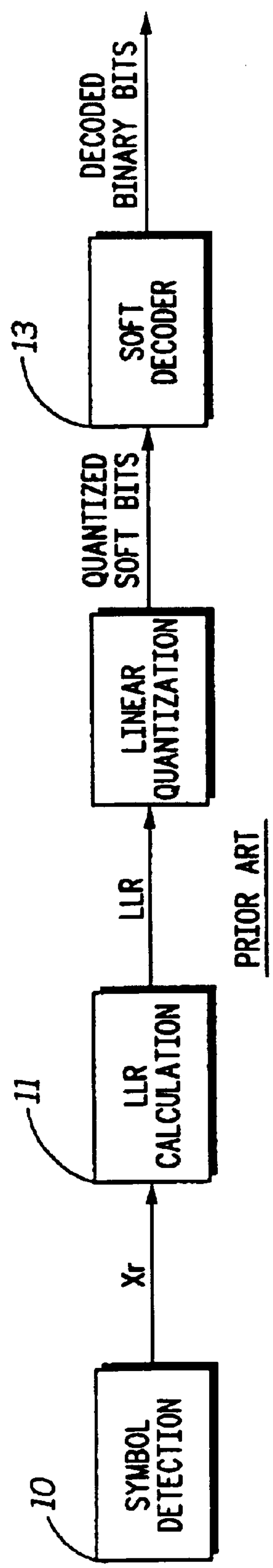
FIG. 1 is a block circuit diagram of a prior art error-correction coding scheme.

While the specification concludes with claims defining the features of the invention that are regarded as novel, it is believed that the invention will be better understood from a consideration of the following description in conjunction with the drawing figures, in which like reference numerals are carried forward.

Figure 2:
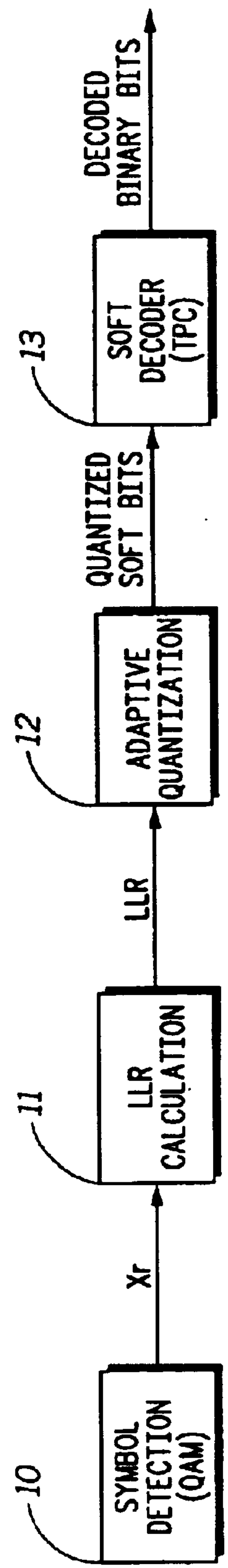
FIG. 2 is a block circuit diagram of an error-correction coding scheme according to the invention.

Referring now to FIG. 2, the invention improves existing quantization methods by replacing the linear quantization device with an adaptive quantization device applying the adaptive quantization method according to the invention.

The method according to the invention can be used for supplying the adaptive quantized soft bits to a TPC-type soft decoder, for example. TPC is a coding technique to be used for most of the modulation techniques. For example, it can be use for a single carrier modulation such as QAM modulation or PSK modulation, or for a multi-carrier modulation, such as a SAM modulation, which is used in wideband radio products.

Specifically, FIG. 2 shows an LLR calculator 11 receiving, from a symbol detector 10, a symbol of a single-carrier or a multi-carrier signal in the form of a complex number Xr. The LLR calculator 11 demodulates the symbol to true soft bits with the log likelihood ratio (LLR) calculation. According to the invention, the LLR of the soft bits is, then, is fed to an adaptive quantization device 12 for quantizing the continuous LLR to discrete soft bits. Finally, the adaptively quantized LLR is fed to a soft decoder 13, preferably, a TPC decoder. An example TPC decoder that can be used in the method according to the invention is a soft decoder made by Advanced Hardware Architectures, Inc.

Output from the LLR calculator 11 before quantization is a continuous number of soft bits, in other words, they are not integers. As set forth above, each LLR of soft bits has a distribution with varying magnitudes. In order to effect decoding (for example, TPC decoding), the true soft bits need to be quantized into digital soft bits, for example, into sixteen level soft bits numbered 0 to 15. The quantization range is important for placing the soft bits with each of these integers; thus, presenting the question of how to decide the quantization range.

Figure 6:
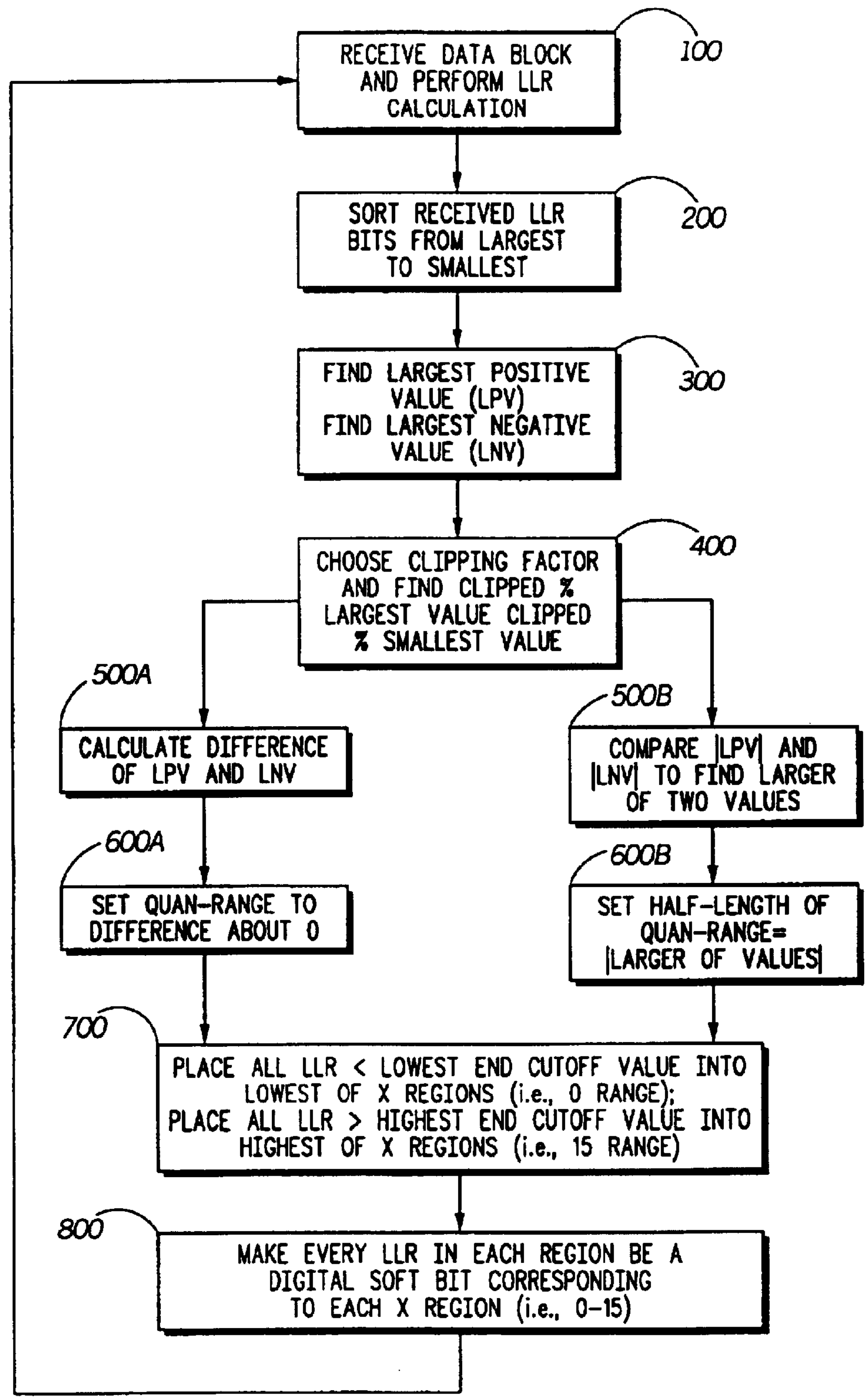
FIG. 6 is a flow chart illustrating an exemplary embodiment of the method according to the invention.

When the LLR is ready to be processed, each bit from a real continuous number is quantized into a given number of levels. The adaptive quantization of these levels according to the invention will be described in connection with the flow chart of FIG. 6. For purposes of a simplified explanation, in the exemplary embodiment of FIG. 6, each true soft bit will be quantized into one of sixteen levels. Of course, this level value is only one example of a number of possible level values.

Figure 3:
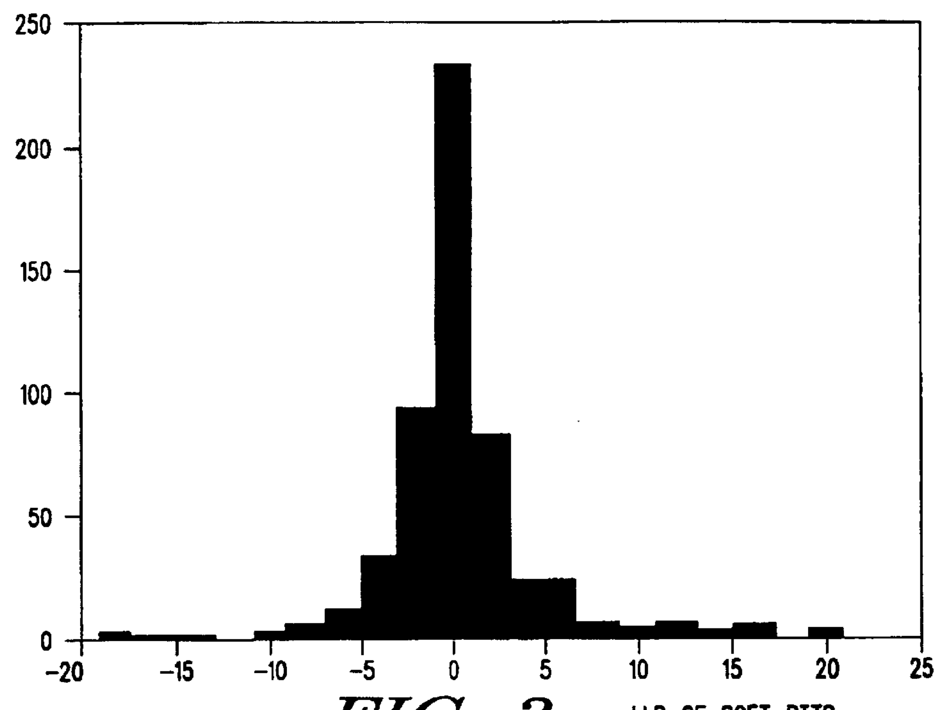
FIG. 3 is a graph illustrating an exemplary LLR distribution of soft bits.
Figure 4:
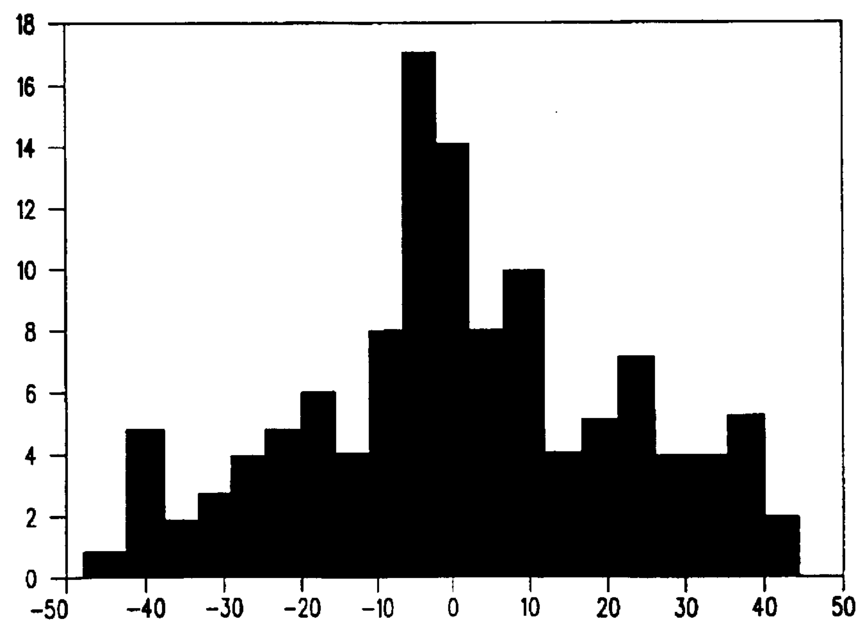
FIG. 4 is a graph illustrating a second exemplary LLR distribution of soft bits.
Figure 5:
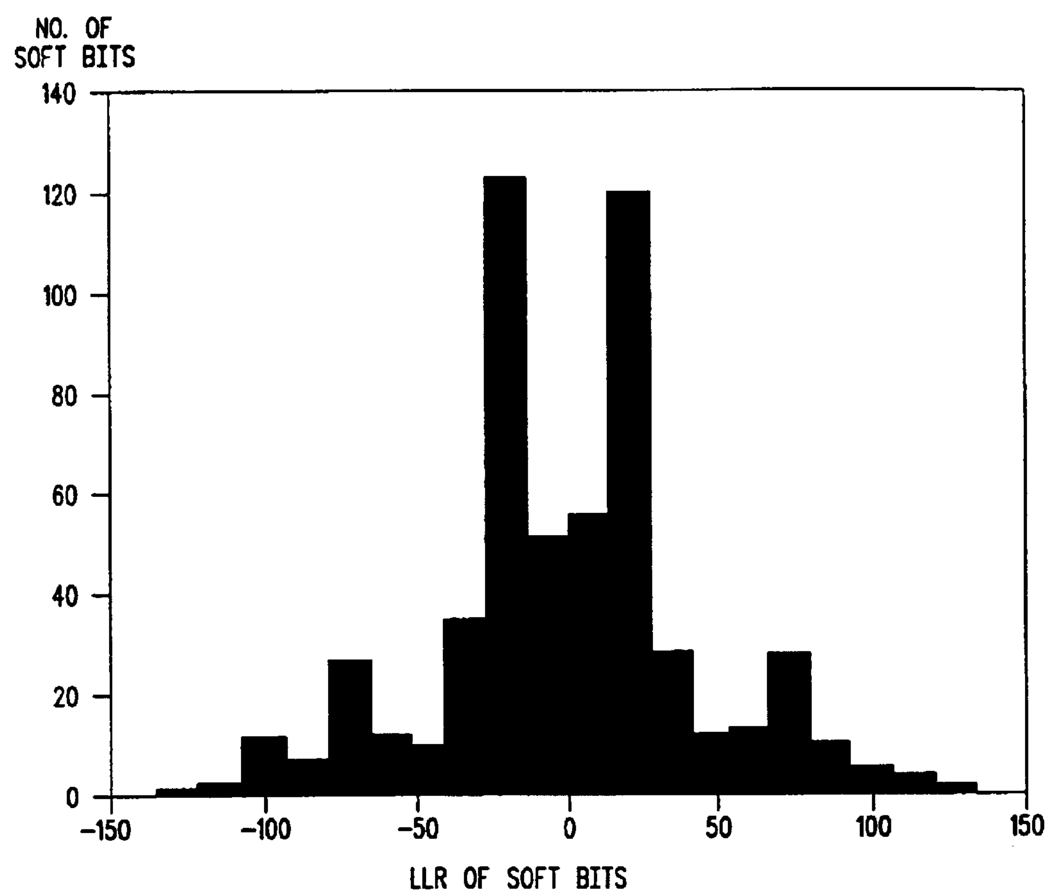
FIG. 5 is a graph illustrating a third exemplary LLR distribution of soft bits.

A quantization range is determined according to the invention whenever the LLR distribution changes for each data block. Thus, the method begins, in step 100, by receiving a data block and performing an LLR calculation. In each data block, the LLR is numerically sorted. See step 200. FIGS. 3, 4, and 5 illustrate three examples of a distribution of an LLR of soft bits in a SAM system. These examples are only exemplary of a substantially large number of possible distributions.

FIG. 3, for example, illustrates an LLR distribution of approximately 550 soft bits spread between −19 and +21 with a high concentration of these soft bits between ±3. FIG. 4 illustrates an LLR distribution of approximately 120 soft bits spread between −48 and +45 with a concentration of these soft bits between ±25. Finally, FIG. 5 illustrates an LLR distribution of approximately 550 soft bits spread between approximately ±135 with a high concentration of these soft bits between ±25.

The sorting in step 200 produces, in step 300, a top value of the LLR and a bottom value of the LLR. These values will be referred to as the largest positive value (LPV) and the largest negative value (LNV), respectively. It is noted that the bottom value of the sort can be positive or the top value of the sort can be negative in an extreme case. The final quantization range can be decided based upon the LPV and the LNV in the exemplary embodiment illustrated in FIG. 6. However, the step of determining the actual LPV and the actual LNV of the distribution can be entirely eliminated as set forth below.

It is observed from FIGS. 3, 4, and 5 that a sub-set of the sorted LLR is located at each of the extremes of the distribution. Because the distributions are widely spread, each of the extreme sub-sets is, in most instances, relatively small. Based upon this observation, a clipping factor can be defined, for which a quantization range is made smaller at both extremes of the distribution. See step 400. Clipping the distribution, therefore, gives a greater resolution for quantization by placing more of an emphasis in the most significant areas of the distribution without losing the extreme LLR soft bits, as these extreme bits will be placed (as described later) within the respective one of the first and last quantized values (i.e., 0 and 15 for a sixteen level case) for a range of selected values.

Setting of a clipped quantization range can be illustrated with respect to each of the examples in FIGS. 3, 4, and 5. If the clipped quantization range is selected to be 20% (in other words the distribution will be focused on the middle 60% of the soft bits), then, for FIG. 3, the LNV and LPV will change from −19 and +21, respectively, to approximately −2.5 and +3. For FIG. 4, the LNV and the LPV will change from −48 and +45, respectively, to approximately −18 and +20. For FIG. 5, the LNV and the LPV will change from −135 and +135, respectively, to approximately −25 and +20. It is noted that clipping 20% from both extremes does not require determination of the actual LPV or the actual LNV. If the number of soft bits is known, then the upper 20% and lower 20% can be disregarded in the quantization range determination. From this, the value 20% from the actual largest value becomes self-evident and the value 20% from the actual smallest value also becomes self-evident. A simplified example illustrates this process. Assuming that there are one hundred (100) soft bits in a distribution, then the twenty (20) uppermost soft bits in the distribution and the twenty (20) lowermost soft bits in the distribution are disregarded and only the middle sixty (60) are used. The sorted distribution inherently produces a LPV of the middle sixty of the soft bits and a LNV of the middle sixty of the soft bits. Accordingly, step 300 is optional.

The clipped range of LLR soft bits can be any percentage of the total range of LLR soft bits. The BER improvement by the method according to the invention depends upon the clipping percentage. The optimized clipping percentage should be found to maximize the BER performance in a given system. Nonetheless, in a preferred embodiment of the method according to the invention, the default clipping value is between 10% and 35%, more specifically, between 15% and 25%, and, in particular, approximately 20%.

Selection of the clipped quantization range in step 400 is, then, used to define the new quantization range for the given data block. Accordingly, the new quantization range is applied to the soft bits in the LLR distribution.

One option for deciding the quantization range is to measure the difference between the LPV and the LNV and, then, to define this difference as a length of the quantization range. This option is indicated in steps 500A and 600A. Using FIG. 3 for example, if the new LPV is 3 and the LNV is −2.5, then the difference is 5.5. The length or span of the quantization range is, therefore, 5.5. To quantize this difference, the range is, therefore, defined to extend from −2.75 to +2.75 and, if sixteen levels are used for the quantization, each level has a range of approximately 0.34375. For any LLR data lying outside the clipped range of −2.75 to +2.75, the data is not discarded. Rather, the data are set to lie within the clipped range. In other words, all LLR values less than −2.75 are set to −2.75. Similarly, all values greater than +2.75 are set to +2.75.

With regard to FIG. 4, if the new LPV is 20 and the LNV is −18, then the difference is 38. The length of the quantization range is, therefore, 38. To quantize this difference, the range is defined to extend from −19 to +19 and, if sixteen levels are used for the quantization, each level has a range of approximately 2.375. For any LLR data that is lying outside the range of −19 to +19, the data is not discarded as set forth above. In other words, all LLR values less than −19 are set to −19. Similarly, all values greater than +19 are set to +19.

Finally, with regard to FIG. 5, if the new LPV is 20 and the LNV is −25, then the difference is 45. The length of the quantization range is, therefore, 45. To quantize this difference, the range is defined to extend from −22.5 to +22.5 and, if sixteen levels are used for the quantization, each level has a range of approximately 2.8125. For any LLR data that is lying outside the range of −22.5 to +22.5, the data is not discarded as set forth above. In other words, all LLR values less than −22.5 are set to −22.5. Similarly, all values greater than +22.5 are set to +22.5.

Another option for deciding the quantization range is to take the larger of the two absolute values of the new LPV and the new LNV and to use the larger absolute value as the half-length of the range. This option is the preferred embodiment and is indicated in steps 500B and 600B. Using FIG. 3 for example, if the LPV is 3 and the LNV is −2.5, then the larger of the two absolute values of −3 and −2.5 is 3. Thus, the half-length of the distribution range becomes 3, making the quantization range span ±3. To quantize this length, the range is defined to extend from −3 to +3 and, if sixteen levels are used for the quantization, each levels has a range or span of approximately 0.375.

With regard to FIG. 4, if the new LPV is 20 and the LNV is −18, then the larger of the two absolute values of the new LPV and the new LNV is 20. The length of the quantization range is, therefore, 40. To quantize this length, the range is defined to extend from −20 to +20 and, if sixteen levels are used for the quantization, each value has a range of approximately 2.5.

Finally, with regard to FIG. 5, if the new LPV is 20 and the LNV is −25, then the larger of the two absolute values of the new LPV and the new LNV is 25. The length of the quantization range is, therefore, 50. To quantize this length, the range is defined to extend from −25 to +25 and, if sixteen levels are used for the quantization, each value has a range of approximately 3.125.

It is noted, however, that instead of having a linear adaptive quantization, meaning levels with equal ranges, the quantization can be non-linear where each level range is different. For example, the middlemost level can be the smallest with the next outer level being successively larger. Any kind of level selection is, therefore, possible to maximize the system BER performance.

Now, each soft bit in the distribution needs to be placed within each of the X equal sections of the quantization range, X being defined as the number of levels to be used in the quantization. In the exemplary embodiment, the modified quantization range is divided up into sixteen equal regions.

However, there are soft bits existing outside the modified and reduced range. As set forth above, for any LLR data that is lying outside the quantization range (i.e., for FIG. 3, such data include values less than −3 and values greater than +3) this data is quantized to the integer value at the respective extreme of the quantization range. If sixteen levels 0 to 15 are selected, then, in step 700, each LLR less than the lower limit of the modified quantization range is placed into level 0 and each LLR greater than the upper limit of the modified quantization range is placed into level 15.

Finally, in step 800, every LLR in each of the sixteen levels is defined to be the integer corresponding to the level in which the LLR exists. Specifically for the FIG. 3 example, all of the LLR less than −3 (if any) is mapped to the integer value 0, the LLR between −3 and approximately −2.625 is also mapped to the integer value 0, the LLR between approximately −2.625 and −2.25 is mapped to the integer value 1, . . . , the LLR between approximately 2.25 and 2.625 is mapped to the integer value 14, the LLR between approximately 2.625 and 3 is mapped to the integer value 15, and the LLR greater than 3 (if any) is also mapped to the integer value 15.

The method then repeats to step 100 for each changed data block.

The method according to the invention can be realized by software code, an example of which may be found in FIG. 7. The code of FIG. 7 decodes, for example, detected QPSK, 16QAM, 64QAM symbols to soft bits of a quantization level and implements the preferred option for deciding the quantization range.

As set forth in FIG. 7, the LLR soft bits are calculated and then sorted. The example LLR calculation is merely an exemplary embodiment of a possible LLR calculation. The clipping threshold is applied and the quantization levels are determined. Finally, the LLR soft bits are quantized into decoded soft bits.

The adaptive quantization according to the invention changes the quantization range adaptively when the LLR distribution is changed rapidly because of signal power, fading channel, and/or modulation type change.

When such an adaptive quantization scheme is used, then the variance of the LLR does not have an effect on the quantized soft values. As such, any fixed amplitude term and the variance calculation including the Es/No term in the LLR calculation can be ignored, which saves a significant amount of complexity in the acquisition of estimated Es/No from the signal. From this, the only key to obtaining the maximum decoder performance becomes the clipping parameter.

The adaptive quantization according to the invention can provide a near optimum soft detection performance when an optimum clipping factor is found in a given communication system.

While the preferred embodiments of the invention have been illustrated and described, it will be clear that the invention is not so limited. Numerous modifications, changes, variations, substitutions, and equivalents will occur to those skilled in the art without departing from the spirit and scope of the present invention as defined by the appended claims.

I claim:

1. A method for adaptive quantization of soft bits, which comprises:

numerically sorting soft bits of a data block having a log likelihood ratio distribution of the soft bits, each of the soft bits having a value, the sorted soft bits having extreme values;

determining two point values in the log likelihood ratio distribution of the data block respectively located at a clipping distance away from each extreme value of the sorted soft bits;

defining an adapted quantization range with a half-length equal to a larger of two absolute values of the two point values; and placing each of the soft bits within a respective sub-range of the adapted quantization range.

2. A method for adaptive quantization of soft bits, which comprises:

numerically sorting soft bits of a data block having a log likelihood ratio distribution of the soft bits, each of the soft bits having a value, the sorted soft bits having extreme values;

determining two point values in the log likelihood ratio distribution of the data block respectively located at a clipping distance away from each extreme value of the sorted soft bits;

one of:

defining an adapted quantization range with a half-length equal to half of a difference between the two point values; and defining an adapted quantization range with a half-length equal to a larger of two absolute values of the two point values; and placing each of the soft bits within a respective sub-range of the adapted quantization range.

3. A method for adaptive quantization of soft bits, which comprises:

determining an adapted quantization range whenever a log likelihood ratio distribution of an external data block changes by:

numerically sorting soft bits of the data block, each of the soft bits having a value, the sorted soft bits having extreme values;

determining two point values in the log likelihood ratio distribution of the data block respectively located at a clipping distance away from each extreme value of the sorted soft bits;

one of:

defining an adapted quantization range with a half-length equal to half of a difference between the two point values; and defining an adapted quantization range with a half-length equal to a larger of two absolute values of the two point values;

dividing the adapted quantization range into a given number of sub-ranges; and placing each of the soft bits within a respective one of the sub-ranges of the adapted quantization range.

4. The method according to claim 3, which further comprises:

assigning a given integer to each of the sub-ranges; and carrying out the placing step by defining each of the soft bits having a value within a respective one of the sub-ranges to be equal to the given integer of the corresponding respective one of the sub-ranges.

5. The method according to claim 4, which further comprises carrying out the placing step by defining each of the soft bits having a value outside all of the sub-ranges to be equal to the given integer of the nearest one of the sub-ranges.

6. The method according to claim 4, which further comprises carrying out the placing step by:

defining each of the soft bits having a value less than the lowest value of the adapted quantization range to be equal to the given integer corresponding to the lowest one of the sub-ranges; and defining each of the soft bits having a value greater than the highest value of the adapted quantization range to be equal to the given integer corresponding to the highest one of the sub-ranges.

7. The method according to claim 4, which further comprises supplying the distribution of the given integers to a soft decoder and outputting decoded binary bits with the soft decoder.

8. The method according to claim 3, which further comprises carrying out the placing step by defining each one of the soft bits as an integer equal to an integer identifier of a respective one of the sub-ranges.

9. The method according to claim 3, which further comprises receiving the data block and performing a log likelihood ratio calculation to produce the soft bits of the data block in the log likelihood ratio distribution.

10. The method according to claim 3, wherein the two point value determination step is carried out by determining two point values in the log likelihood ratio distribution located at a respective one of two clipping distances away from each extreme value of the sorted soft bits.

11. The method according to claim 3, wherein the clipping distance corresponds to between approximately 10% and approximately 35% of the range of values for the soft bits of the log likelihood ratio distribution.

12. The method according to claim 11, wherein the clipping distance corresponds to between approximately 15% and approximately 25%.

13. The method according to claim 12, wherein the clipping distance corresponds to approximately 20%.

14. The method according to claim 3, which further comprises carrying out the dividing step by dividing the adapted quantization range into sixteen sub-ranges.

15. The method according to claim 3, wherein each of the sub-ranges has a given width.

16. The method according to claim 15, wherein the given width of all of the sub-ranges is the same.

17. The method according to claim 15, wherein at least one given width of at least one of the sub-ranges is different from at least another given width of another of the sub-ranges.

18. The method according to claim 3, wherein the adapted quantization range is centered at 0.

19. The method according to claim 3, which further comprises repeating the sorting, determining, defining, dividing, and placing steps for each changed external data block.

20. The method according to claim 3, wherein the value of each of the soft bits is a log likelihood ratio.

21. In an error correction coding device having a soft decoder and a log likelihood ratio calculation device providing a continuous log likelihood ratio value of demodulated true soft bits, the values of the soft bits of a data block forming a log likelihood ratio distribution, a quantization device comprising:

an adaptive quantizer connected to the soft decoder and to the log likelihood ratio calculation device, said adaptive quantizer adaptively quantizing the demodulated true soft bits into discrete soft bits, said adaptive quantizer being programmed:

to numerically sort the soft bits of the data block, each of the soft bits having a value, the sorted soft bits having extreme values;

to determine two point values in the log likelihood ratio distribution of the data block respectively located at a clipping distance away from each of the extreme values of the sorted soft bits;

to define an adapted quantization range with sub-ranges, said adapted quantization range having a half-length equal to a larger of two absolute values of the two point values; and to place each of the soft bits within a respective one of said sub-ranges.

22. The method according to claim 21, wherein said adaptive quantizer is programmed to assign integer values corresponding to each of said sub-ranges to each of the soft bits within a respective one of said sub-ranges to, thereby, create adaptively quantized discrete soft bits.

23. The device according to claim 22, wherein said adaptive quantizer is programmed to supply the adaptively quantized discrete soft bits to the soft decoder.

24. The device according to claim 23, wherein the soft decoder is a TPC decoder.

25. The device according to claim 21, wherein the extreme values are two extreme values.

26. The device according to claim 21, wherein the value of each of the soft bits is a log likelihood ratio.

27. A quantization device, comprising an adaptive quantizer being programmed:

to numerically sort soft bits of a data block having a log likelihood ratio distribution, each of the soft bits having a value, the sorted soft bits having extreme values;

to determine two point values in the log likelihood ratio distribution of the data block respectively located at a clipping distance away from each of the extreme values of the sorted soft bits;

to define an adapted quantization range with sub-ranges, said adapted quantization range having a half-length equal to a larger of two absolute values of the two point values; and to place each of the soft bits within a respective one of said sub-ranges.

28. A quantization device, comprising:

means for numerically sorting soft bits of a data block having a log likelihood ratio distribution, each of the soft bits having a value, the sorted soft bits having extreme values;

means for determining two point values in the log likelihood ratio distribution of the data block respectively located at a clipping distance away from each of the extreme values of the sorted soft bits;

means for defining an adapted quantization range with sub-ranges, said adapted quantization range having a half-length equal to a larger of two absolute values of the two point values; and means for placing each of the soft bits within a respective one of said sub-ranges.

29. The device according to claim 28, including means for assigning integer values corresponding to each of said sub-ranges to each of the soft bits within a respective one of said sub-ranges to, thereby, create adaptively quantized discrete soft bits.

30. An error correction coding system, comprising:

a log likelihood ratio calculation device receiving a signal as a complex number Xr and outputting a continuous log likelihood ratio value of demodulated true soft bits in a data block forming a log likelihood ratio distribution;

a soft decoder;

an adaptive quantizer connected to said soft decoder and to said log likelihood ratio calculation device, said adaptive quantizer being programmed to adaptively quantize the demodulated true soft bits into discrete soft bits by:

numerically sorting the soft bits of the data block, each of the soft bits having a value, the sorted soft bits having extreme values;

determining two point values in the log likelihood ratio distribution of the data block respectively located at a clipping distance away from each of the extreme values of the sorted soft bits;

defining an adapted quantization range with sub-ranges, said adapted quantization range having a half-length equal to a larger of two absolute values of the two point values;

assigning integer values corresponding to each of said sub-ranges to each of the soft bits within a respective one of said sub-ranges to, thereby, create adaptively quantized discrete soft bits; and providing the adaptively quantized discrete soft bits to said soft decoder; and said soft decoder decoding said adaptively quantized discrete soft bits and outputting decoded binary bits.

* * * * *